(12) United States Patent
Yang et al.

(10) Patent No.: US 10,141,434 B2
(45) Date of Patent: Nov. 27, 2018

(54) COMPLEMENTARY TUNNELING FIELD EFFECT TRANSISTOR AND MANUFACTURING METHOD THEREFOR

(71) Applicant: Huawei Technologies Co., Ltd., Shenzhen, Guangdong (CN)

(72) Inventors: Xichao Yang, Shenzhen (CN); Jing Zhao, Shenzhen (CN); Chen-Xiong Zhang, Plano, TX (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/587,781

(22) Filed: May 5, 2017

(65) Prior Publication Data

US 2017/0243960 A1    Aug. 24, 2017

Related U.S. Application Data

(63) Continuation of application No. PCT/CN2015/077523, filed on Apr. 27, 2015.

(30) Foreign Application Priority Data

Nov. 7, 2014   (CN) .......................... 2014 1 0623588

(51) Int. Cl.
*H01L 29/66*    (2006.01)
*H01L 29/78*    (2006.01)
(Continued)

(52) U.S. Cl.
CPC .................. *H01L 29/66977* (2013.01); *H01L 21/823807* (2013.01); *H01L 21/823814* (2013.01);
(Continued)

(58) Field of Classification Search
None
See application file for complete search history.

(56) References Cited

U.S. PATENT DOCUMENTS 5,705,827 A      1/1998  Baba et al.
2004/0256639 A1  12/2004 Ouyang et al.
(Continued)

FOREIGN PATENT DOCUMENTS

CN      1574253 A     2/2005
CN      102142461 A   8/2011
(Continued)

OTHER PUBLICATIONS

Wang, Peng-Fei, "Complementary Tunneling-FETs (CTFET) in CMOS Technology," Technische Universität München, Lehrstuhl für Technische Elektronik, Fachgebiet Halbleiterproduktionstechnik, 184 pages.
(Continued)

*Primary Examiner* — Shaun Campbell (57) ABSTRACT

A complementary tunneling field effect transistor and a manufacturing method are disclosed, which includes: a first drain region and a first source region that are disposed on a substrate, where they include a first dopant; a first channel that is disposed on the first drain region and a second channel that is disposed on the first source region; a second source region that is disposed on the first channel and a second drain region that is disposed on the second channel, where they include a second dopant; a first epitaxial layer that is disposed on the first drain region and the second source region, and a second epitaxial layer that is disposed on the second drain region and the first source region; and a first gate stack layer that is disposed on the first epitaxial layer, and a second gate stack layer that is disposed on the second epitaxial layer.

10 Claims, 7 Drawing Sheets

(51) Int. Cl.
*H01L 29/08* (2006.01)
*H01L 29/739* (2006.01)
*H01L 21/8238* (2006.01)
*H01L 27/092* (2006.01)
*H01L 29/06* (2006.01)
*H01L 29/423* (2006.01)
*H01L 29/49* (2006.01)
*H01L 29/786* (2006.01)

(52) U.S. Cl.
CPC ........ *H01L 21/823828* (2013.01); *H01L 21/823878* (2013.01); *H01L 21/823885* (2013.01); *H01L 27/092* (2013.01); *H01L 29/0653* (2013.01); *H01L 29/0676* (2013.01); *H01L 29/08* (2013.01); *H01L 29/42356* (2013.01); *H01L 29/42392* (2013.01); *H01L 29/4908* (2013.01); *H01L 29/66356* (2013.01); *H01L 29/7391* (2013.01); *H01L 29/78* (2013.01); *H01L 29/78618* (2013.01); *H01L 29/78642* (2013.01); *H01L 29/78651* (2013.01); *H01L 29/78681* (2013.01); *H01L 29/78684* (2013.01); *H01L 29/78696* (2013.01)

(56) References Cited

U.S. PATENT DOCUMENTS

| | | |
|---|---|---|
| 2010/0163845 A1 | 7/2010 | Goel et al. |
| 2011/0083387 A1 | 4/2011 | Babbitt et al. |
| 2012/0113726 A1 | 5/2012 | Huang et al. |
| 2012/0319167 A1* | 12/2012 | van Dal .......... H01L 21/823807 257/192 |
| 2014/0021532 A1 | 1/2014 | Bhuwalka et al. |
| 2014/0054549 A1* | 2/2014 | Loh .................. H01L 29/66356 257/27 |
| 2014/0252455 A1 | 9/2014 | Chuang et al. |

FOREIGN PATENT DOCUMENTS

| | | |
|---|---|---|
| CN | 102456745 A | 5/2012 |
| CN | 104134695 A | 11/2014 |
| CN | 104332502 A | 2/2015 |
| EP | 2378557 A1 | 10/2011 |
| JP | H05175514 A | 7/1993 |

OTHER PUBLICATIONS

Heyns et al.; "Shaping the Future of Nanoelectronics Beyond the Si Roadmap with New Materials and Devices"; Optical Microlithography XXIII; vol. 7640; 2010; 15 pages.

* cited by examiner

COMPLEMENTARY TUNNELING FIELD EFFECT TRANSISTOR AND MANUFACTURING METHOD THEREFOR

CROSS-REFERENCE TO RELATED APPLICATIONS

This application is a continuation of International Application No. PCT/CN2015/077523, filed on Apr. 27, 2015, which claims priority to Chinese Patent Application No. 201410623588.6, filed on Nov. 7, 2014. The disclosures of the aforementioned applications are hereby incorporated by reference in their entireties.

TECHNICAL FIELD

The present application relates to the field of semiconductor technologies, and in particular, to a complementary tunneling field effect transistor and a manufacturing method therefor.

BACKGROUND

With evolution of a transistor manufacturing process, a transistor size becomes smaller. However, in a process of reducing the transistor size to near a physical limit, there are many problems with the transistor, such as serious short channel effect, a big leakage current, and large power density. To resolve these problems, the industry puts forward various solutions. A TFET (Tunneling Field Effect Transistor) attracts wide attention because it has advantages of weak short channel effect, a small off-state current, no limitation by a subthreshold swing of an MOSFET (Metal Oxide Semiconductor Field Effect Transistor), and the like.

Figure 1:
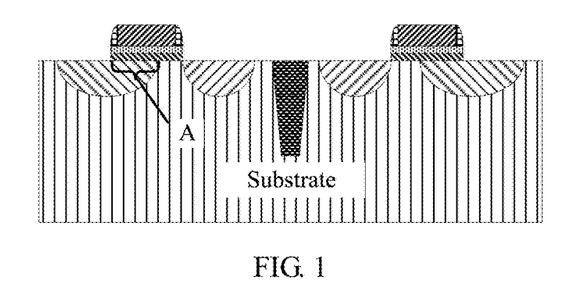
FIG. 1 is a schematic structural diagram of a tunneling field effect transistor in the prior art.

FIG. 1 shows an existing tunneling field effect transistor. For a tunneling field effect transistor of this structure, in a manufacturing process, ion injection of different types is performed on a source region and a drain region separately. To increase a tunneling current, a gate region and the source region are partially overlapped (as shown by A in FIG. 1) in the manufacturing process. Under an action of a gate electric field, band-to-band tunneling occurs on a carrier, thereby producing a channel current. In the tunneling field effect transistor with a line tunneling working mechanism, a carrier tunneling direction is parallel to a gate electric field direction, a gate control capability is relatively strong, and a tunneling current magnitude may be regulated according to an overlapping area of the gate region and the source region.

In the prior art, the source region and the drain region of the tunneling field effect transistor are doped with impurities in an ion injection manner. However, impurity concentration distribution formed in the source region and the drain region in an ion injection process is generally Gaussian distribution. Therefore, when the ion injection process is used, ions are not evenly distributed, and a tunneling junction with mutant doping is difficult to form. Under an action of a specific gate electric field, carrier tunneling efficiency is relatively low.

SUMMARY

Embodiments of the present application provide a complementary tunneling field effect transistor and a manufacturing method therefor, so as to increase carrier tunneling efficiency and improve performance of the tunneling field effect transistor.

To achieve the foregoing objective, the following technical solutions are used in the embodiments of the present application.

According to a first aspect, an embodiment of the present application provides a complementary tunneling field effect transistor, including:

a first drain region and a first source region that are disposed on a substrate, where the first drain region and the first source region include a first dopant; a first channel that is disposed on the first drain region and a second channel that is disposed on the first source region; a second source region that is disposed on the first channel and a second drain region that is disposed on the second channel, where the second source region and the second drain region include a second dopant; a first epitaxial layer that is disposed on the first drain region and the second source region, and a second epitaxial layer that is disposed on the second drain region and the first source region, where the first epitaxial layer covers a side wall of the first channel and the second source region, and the second epitaxial layer covers a side wall of the second channel and the second drain region; and a first gate stack layer that is disposed on the first epitaxial layer, and a second gate stack layer that is disposed on the second epitaxial layer, where the first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

With reference to the first aspect, in a first possible implementation manner of the first aspect, the first dopant is a P-type dopant and the second dopant is an N-type dopant, or the first dopant is an N-type dopant and the second dopant is a P-type dopant; and impurity concentration of the first dopant and the second dopant is within a range from $10^{19}$ per cubic centimeter to $10^{21}$ per cubic centimeter (including $10^{19}$ and $10^{21}$); the first channel and the second channel are lightly doped layers or first insulation layers; and impurity concentration in the lightly doped layers is less than or equal to $10^{15}$ per cubic centimeter.

With reference to the first aspect, in a second possible implementation manner of the first aspect, the first gate stack layer includes a first gate medium layer and a first gate conductive layer, and the second gate stack layer includes a second gate medium layer and a second gate conductive layer; and the complementary tunneling field effect transistor further includes: a first isolator that is disposed on the second source region and the first drain region, and a second isolator that is disposed on the first source region and the second drain region, where the first isolator is in contact with the first epitaxial layer and the first gate stack layer, and the second isolator is in contact with the second epitaxial layer and the second gate stack layer; a second insulation layer that is disposed on the second source region, the first gate stack layer, the first drain region, the first source region, the second gate stack layer, and the second drain region; a first drain that is disposed on the first drain region, a first source that is disposed on the second source region, and a first gate that is disposed on the first gate conductive layer; and a second drain that is disposed on the second drain region, a second source that is disposed on the first source region, and a second gate that is disposed on the second gate conductive layer.

With reference to the first aspect, the first possible implementation manner of the first aspect, or the second possible implementation manner of the first aspect, in a third possible implementation manner of the first aspect, the complementary tunneling field effect transistor further includes: a shallow isolation groove that is disposed between the first drain region and the first source region.

With reference to the first aspect, the first possible implementation manner of the first aspect, or the second possible implementation manner of the first aspect, in a fourth possible implementation manner of the first aspect, materials of the substrate, the first drain region, the first source region, the second drain region, the second source region, the first epitaxial layer, the second epitaxial layer, the first channel, and the second channel are all silicon, germanium, germanium silicon, or three-five compounds; and materials of the first gate medium layer and the second gate medium layer are silicon dioxide, silicon nitride, or high dielectric materials, and materials of the first gate conductive layer and the second gate conductive layer are polycrystalline silicon, titanium nitride, or metal materials.

According to a second aspect, an embodiment of the present application provides a complementary tunneling field effect transistor manufacturing method, where the manufacturing method includes:

successively depositing a first doped layer, a channel layer, and a second doped layer on a substrate, where the first doped layer includes a first dopant, and the second doped layer includes a second dopant; etching the second doped layer, the channel layer, and the first doped layer to form a second source region, a second drain region, a first channel, a second channel, a first drain region, and a first source region, where the first channel is located on the first drain region, the second source region is located on the first channel, the second channel is located on the first source region, and the second drain region is located on the second channel; successively depositing an epitaxial layer and a gate stack layer on the second source region, the first drain region, the first source region, and the second drain region; and etching the gate stack layer and the epitaxial layer to successively form a first gate stack layer, a second gate stack layer, a first epitaxial layer, and a second epitaxial layer, where the first gate stack layer is located above the first epitaxial layer, the second gate stack layer is located above the second epitaxial layer, the first epitaxial layer covers a side wall of the first channel and the second source region, and the second epitaxial layer covers a side wall of the second channel and the second drain region; and the first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

With reference to the second aspect, in a first possible implementation manner of the second aspect, the first dopant is a P-type dopant and the second dopant is an N-type dopant, or the first dopant is an N-type dopant and the second dopant is a P-type dopant; and impurity concentration of the first dopant and the second dopant is within a range from $10^{19}$ per cubic centimeter to $10^{21}$ per cubic centimeter (including $10^{19}$ and $10^{21}$); the first channel and the second channel are lightly doped layers or first insulation layers; and impurity concentration in the lightly doped layers is less than or equal to $10^{15}$ per cubic centimeter.

With reference to the second aspect or the first possible implementation manner of the second aspect, in a second possible implementation manner of the second aspect, the first gate stack layer includes a first gate medium layer and a first gate conductive layer, and the second gate stack layer includes a second gate medium layer and a second gate conductive layer; and after the etching the gate stack layer and the epitaxial layer to successively form a first gate stack layer, a second gate stack layer, a first epitaxial layer, and a second epitaxial layer, the manufacturing method further includes: disposing a first isolator on the second source region and the first drain region, and disposing a second isolator on the first source region and the second drain region, where the first isolator is in contact with the first epitaxial layer and the first gate stack layer, and the second isolator is in contact with the second epitaxial layer and the second gate stack layer; disposing a second insulation layer on the second source region, the first gate stack layer, the first drain region, the first source region, the second gate stack layer, and the second drain region; and etching the second insulation layer, forming a first drain on the first drain region, forming a first source on the second source region, forming a first gate on the first gate conductive layer, forming a second drain on the second drain region, forming a second source on the first source region, and forming a second gate on the second gate conductive layer.

With reference to the second aspect, the first possible implementation manner of the second aspect, or the second possible implementation manner of the second aspect, in a third possible implementation manner of the second aspect, after depositing the first doped layer on the substrate, and before depositing the channel layer, the manufacturing method further includes: disposing a shallow isolation groove on the first doped layer, where the shallow isolation groove is located between the first drain region and the first source region.

With reference to the second aspect, the first possible implementation manner of the second aspect, or the second possible implementation manner of the second aspect, in a fourth possible implementation manner of the second aspect, materials of the substrate, the first drain region, the first source region, the second drain region, the second source region, the first epitaxial layer, the second epitaxial layer, the first channel, and the second channel are all silicon, germanium, germanium silicon, or three-five compounds; and materials of the first gate medium layer and the second gate medium layer are silicon dioxide, silicon nitride, or high dielectric materials, and materials of the first gate conductive layer and the second gate conductive layer are polycrystalline silicon, titanium nitride, or metal materials.

The embodiments of the present application provide a complementary tunneling field effect transistor and a manufacturing method therefor. The complementary tunneling field effect transistor includes: a first drain region and a first source region that are disposed on a substrate, where the first drain region and the first source region include a first dopant; a first channel that is disposed on the first drain region and a second channel that is disposed on the first source region; a second source region that is disposed on the first channel and a second drain region that is disposed on the second channel, where the second source region and the second drain region include a second dopant; a first epitaxial layer that is disposed on the first drain region and the second source region, and a second epitaxial layer that is disposed on the second drain region and the first source region, where the first epitaxial layer covers a side wall of the first channel and the second source region, and the second epitaxial layer covers a side wall of the second channel and the second drain region; and a first gate stack layer that is disposed on the first epitaxial layer, and a second gate stack layer that is disposed on the second epitaxial layer, where the first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

Based on the foregoing embodiment descriptions, the complementary tunneling field effect transistor provided in the embodiments of the present application includes a first tunneling field effect transistor and a second tunneling field effect transistor. The first tunneling field effect transistor includes a first drain region, a first channel, a second source region, a first epitaxial layer, and a first gate stack layer. The second tunneling field effect transistor includes a second drain region, a second channel, a first source region, a second epitaxial layer, and a second gate stack layer. The first drain region and the first source region include a first dopant, and the second source region and the second drain region include a second dopant. The first source region and the first drain region, and the second source region and the second drain region are separately formed by depositing and etching a semiconductor material once, and the first dopant and the second dopant are doped in the semiconductor material by means of stirring or the like. Therefore, the first dopant and the second dopant are evenly distributed instead of Gaussian distribution of ion injected dopants in the prior art. Therefore, impurity concentration between the second source region and the first epitaxial layer and between the first source region and the second epitaxial layer may be mutated in a relatively short distance, so as to increase carrier tunneling efficiency and improve performance of the tunneling field effect transistor.

BRIEF DESCRIPTION OF THE DRAWINGS

To describe the technical solutions in the embodiments of the present application or in the prior art more clearly, the following briefly describes the accompanying drawings required for describing the embodiments or the prior art. Apparently, the accompanying drawings in the following description show merely some embodiments of the present application, and persons of ordinary skill in the art may still derive other drawings from these accompanying drawings without creative efforts.

DETAILED DESCRIPTION

The following clearly describes the technical solutions in the embodiments of the present application with reference to the accompanying drawings in the embodiments of the present application. Apparently, the described embodiments are merely some rather than all of the embodiments of the present application.

Embodiment 1

Figure 2:
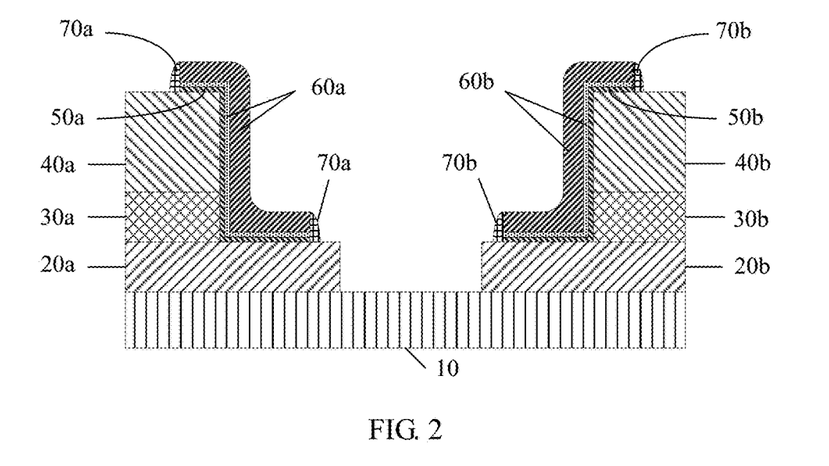
FIG. 2 is a first schematic structural diagram of a complementary tunneling field effect transistor according to an embodiment of the present application.

This embodiment of the present application provides a complementary tunneling field effect transistor. FIG. 2 is a schematic structural diagram of the tunneling field effect transistor.

The tunneling field effect transistor includes: a substrate 10; a first drain region 20a and a first source region 20b that are disposed on the substrate 10, where the first drain region 20a and the first source region 20b include a first dopant; a first channel 30a that is disposed on the first drain region 20a and a second channel 30b that is disposed on the first source region 20b; a second source region 40a that is disposed on the first channel 30a and a second drain region 40b that is disposed on the second channel 30b, where the second source region 40a and the second drain region 40b include a second dopant; a first epitaxial layer 50a that is disposed on the first drain region 20a and the second source region 40a, and a second epitaxial layer 50b that is disposed on the second drain region 40b and the first source region 20b, where the first epitaxial layer 50a covers a side wall of the first channel 30a and the second source region 40a, and the second epitaxial layer 50b covers a side wall of the second channel 30b and the second drain region 40b; and a first gate stack layer 60a that is disposed on the first epitaxial layer 50a, and a second gate stack layer 60b that is disposed on the second epitaxial layer 50b.

The first drain region 20a, the first channel 30a, the second source region 40a, the first epitaxial layer 50a, and the first gate stack layer 60a form a first tunneling field effect transistor, and the second drain region 40b, the second channel 30b, the first source region 20b, the second epitaxial layer 50b, and the second gate stack layer 60b form a second tunneling field effect transistor.

It should be noted that the first dopant is a P-type dopant and the second dopant is an N-type dopant, or the first dopant is an N-type dopant and the second dopant is a P-type dopant.

Further, if the first dopant is an N-type dopant and the second dopant is a P-type dopant, the first tunneling field effect transistor is an N-type tunneling field effect transistor, and the second tunneling field effect transistor is a P-type tunneling field effect transistor; or if the first dopant is a P-type dopant and the second dopant is an N-type dopant, the first tunneling field effect transistor is a P-type tunneling field effect transistor, and the second tunneling field effect transistor is an N-type tunneling field effect transistor.

It should be noted that the first drain region 20a, the first source region 20b, the second source region 40a, and the second drain region 40b are heavily doped. It may be understood that impurity concentration of the first dopant included in the first drain region 20a and the first source region 20b and the second dopant included in the second source region 40a and the second drain region 40b is within a range from $10^{19}$ per cubic centimeter to $10^{21}$ per cubic centimeter (including $10^{19}$ and $10^{21}$) The first channel 30a and the second channel 30b are lightly doped layers or first insulation layers.

It should be noted that, the lightly doped layer may be understood that an impurity is evenly added to a semiconductor thin film, and impurity concentration is less than or equal to $10^{15}$ per cubic centimeter. A material of the semiconductor thin film is germanium, silicon, germanium silicon, or a three-five compound. The first channel 30a and the second channel 30b may also be first insulation layers, and thickness of the first channel 30a and the second channel 30b is from tens of nanometers to hundreds of nanometers. It should be further added that the impurity in the lightly doped layer may be a donor impurity or an acceptor impurity. This is not limited in the present application.

It should be further added that the substrate 10 is a semiconductor substrate, and a specific material of the substrate 10 may be germanium, silicon, germanium silicon, or a three-five compound. The first epitaxial layer 50a and the second epitaxial layer 50b are lightly doped semiconductor thin films, and a material of the semiconductor thin film is germanium, silicon, germanium silicon, or a three-five compound. The light doping means that added impurity concentration is less than or equal to $10^{15}$ per cubic centimeter. Thickness of the first epitaxial layer 50a and the second epitaxial layer 50b is between 1 nanometer and 10 nanometers.

It should be noted that the first gate stack layer 60a includes a first gate medium layer and a first gate conductive layer, and the second gate stack layer 60b includes a second gate medium layer and a second gate conductive layer. The first gate conductive layer is located above the first gate medium layer, and the second gate conductive layer is located above the second gate medium layer. Materials of the first gate medium layer and the second gate medium layer may be silicon dioxide, silicon nitride, high dielectric materials, or other insulating materials. Materials of the first gate conductive layer and the second gate conductive layer may be polycrystalline silicon, titanium nitride, metals, or other conductive materials, and thickness of the first gate conductive layer and the second gate conductive layer is tens of nanometers.

Further, the complementary tunneling field effect transistor further includes: a first isolator 70a that is disposed on the second source region 40a and the first drain region 20a, and a second isolator 70b that is disposed on the first source region 20b and the second drain region 40b, where the first isolator 70a is in contact with the first epitaxial layer 50a and the first gate stack layer 60a, and the second isolator 70b is in contact with the second epitaxial layer 50b and the second gate stack layer 60b.

It should be added that materials of the first isolator 70a and the second isolator 70b may be silicon dioxide, silicon nitride, high dielectric materials, or other insulating materials.

Figure 3:
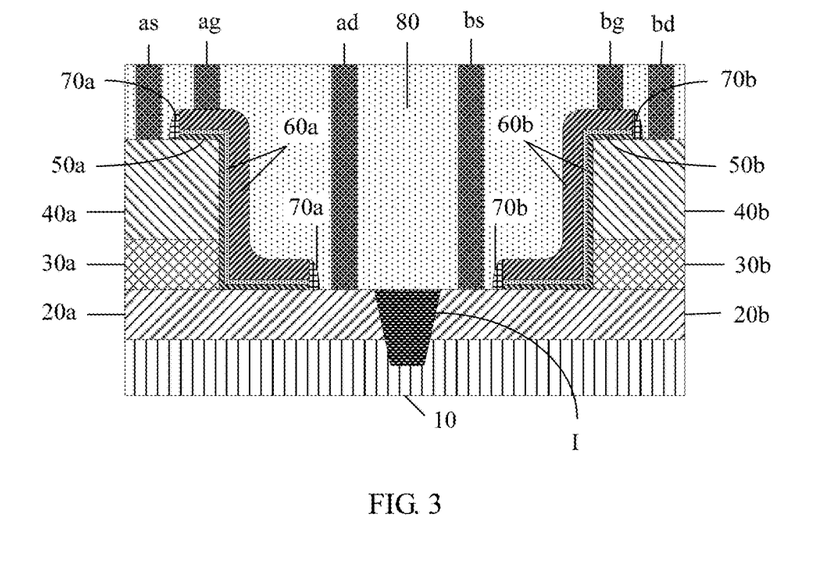
FIG. 3 is a second schematic structural diagram of a complementary tunneling field effect transistor according to an embodiment of the present application.

Further, as shown in FIG. 3, the tunneling field effect transistor further includes a second insulation layer 80 that is disposed on the second source region 40a, the first gate stack layer 60a, the first drain region 20a, the first source region 20b, the second gate stack layer 60b, and the second drain region 40b. A material of the second insulation layer 80 is a low dielectric material or another insulating material.

Further, the complementary tunneling field effect transistor further includes: a first drain ad that is disposed on the first drain region 20a, a first source as that is disposed on the second source region 40a, a first gate ag that is disposed on the first gate conductive layer, a second drain bd that is disposed on the second drain region 40b, a second source bs that is disposed on the first source region 20b, and a second gate bg that is disposed on the second gate conductive layer. The first drain ad, the second source bs, the first gate ag, the first source as, the second drain bd, and the second gate bg are not in contact with each other, and may all be metal electrodes.

As shown in FIG. 3, in this embodiment of the present application, the complementary tunneling field effect transistor that combines the N-type tunneling field effect transistor and the P-type tunneling field effect transistor further includes a shallow isolation groove I that is disposed on the substrate 10, and the shallow isolation groove I is located between the first drain region 20a and the first source region 20b. Because both the first drain region 20a and the first source region 20b include the first dopant, the shallow isolation groove I is configured to isolate the first drain region 20a and the first source region 20b that are adjacent to each other.

Further, the complementary tunneling field effect transistor provided in this embodiment of the present application uses a line tunneling working mechanism. The line tunneling working mechanism means that a carrier tunneling direction is parallel to a gate electric field direction, a gate control capability is relatively strong, and a tunneling current magnitude may be regulated according to an overlapping area of a gate region and a source region.

A transistor on-state current is provided by a tunneling junction formed by the source region and an epitaxial layer. Specifically, an on-state current of the N-type tunneling field effect transistor is formed when an electron in the source region tunnels to the epitaxial layer that is in contact with the source region, and an on-state current of the P-type tunneling field effect transistor is formed when an electron hole in the source region tunnels to the epitaxial layer that is in contact with the source region. Because the line tunneling mechanism has advantages that a carrier tunneling probability can be improved, the on-state current is linearly adjustable in a specific range, and the like, the complementary tunneling field effect transistor provided in the present application has a higher on-state current, a smaller subthreshold swing, and a greater current adjustment degree of freedom.

It should be further added that, generally, similar to an MOSFET, a current driving capability of the P-type tunneling field effect transistor is weaker than a current driving capability of the N-type tunneling field effect transistor. The complementary tunneling field effect transistor provided in this embodiment of the present application may increase a tunneling junction area of the P-type tunneling field effect transistor to increase the on-state current of the P-type tunneling field effect transistor, so as to match the on-state current of the N-type tunneling field effect transistor.

Figure 4:
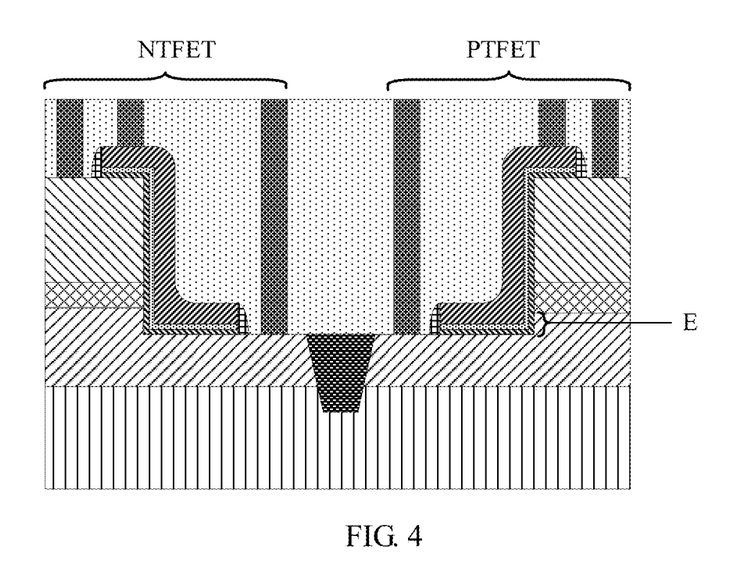
FIG. 4 is a third schematic structural diagram of a complementary tunneling field effect transistor according to an embodiment of the present application.

The complementary tunneling field effect transistor shown in FIG. 3 is used as an example. The tunneling junction area of the P-type tunneling field effect transistor is increased to increase the on-state current of the P-type tunneling field effect transistor, so as to match the on-state current of the N-type tunneling field effect transistor. FIG. 4 is a schematic structural diagram of the obtained complementary tunneling field effect transistor.

Specifically, a first source region of the P-type tunneling field effect transistor part is over-etched to some extent to form an L-shaped surface, as shown by E in FIG. 4, so as to increase the tunneling junction area of the P-type tunneling field effect transistor, and increase the on-state current of the P-type tunneling field effect transistor to match the on-state current of the N-type tunneling field effect transistor.

It should be added that in the complementary tunneling field effect transistor, locations of the N-type tunneling field effect transistor and the P-type tunneling field effect transistor may be interchanged. When the locations of the N-type tunneling field effect transistor and the P-type tunneling field effect transistor are interchanged, corresponding electrodes are also correspondingly changed.

When the P-type tunneling field effect transistor is located at the location of the N-type tunneling field effect transistor shown in FIG. 3, thickness of the second source region may be increased to increase the tunneling junction area of the P-type tunneling field effect transistor, so as to increase the on-state current of the P-type tunneling field effect transistor.

Figure 5:
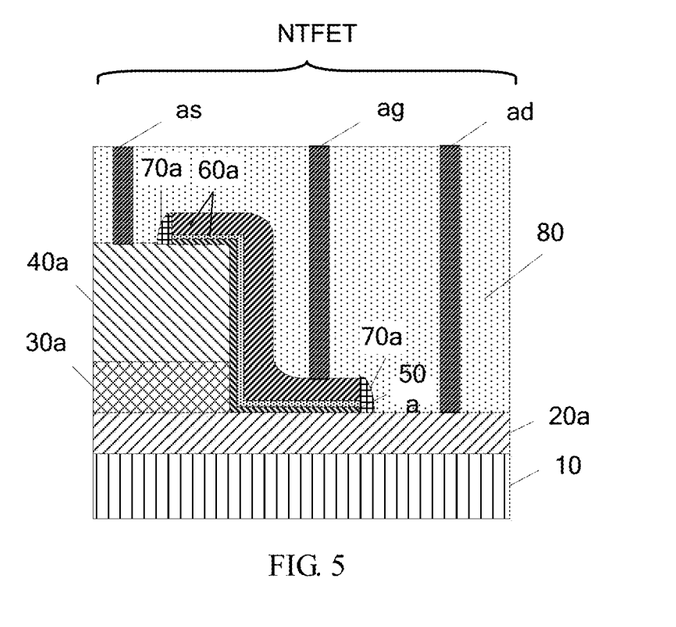
FIG. 5 is a fourth schematic structural diagram of a complementary tunneling field effect transistor according to an embodiment of the present application.

For example, as shown in FIG. 5, a structure of the tunneling field effect transistor provided in this embodiment of the present application may be manufactured as having only the N-type tunneling field effect transistor, including: the substrate 10; the first drain region 20a that is disposed on the substrate 10; the first channel 30a that is disposed on the first drain region; the second source region 40a that is disposed on the first channel 30a; the first epitaxial layer 50a that is disposed on the first drain region 20a and the second source region 40a, where the first epitaxial layer 50a covers the side wall of the second source region 40a and the first channel 30a; the first gate stack layer 60a that is disposed on the first epitaxial layer 50a; the first isolator 70a that is disposed on the first drain region 20a and the second source region 40a, where the first isolator 70a is in contact with the first epitaxial layer 50a and the first gate stack layer 60a; the second insulation layer 80 that is disposed on the first drain region 20a, the second source region 40a, the first isolator 70a, and the first gate stack layer 60a; the first drain ad that is disposed on the first drain region 20a; the first gate ag that is disposed on the first gate conductive layer; and the first source as that is disposed on the second source region 40a.

Figure 6:
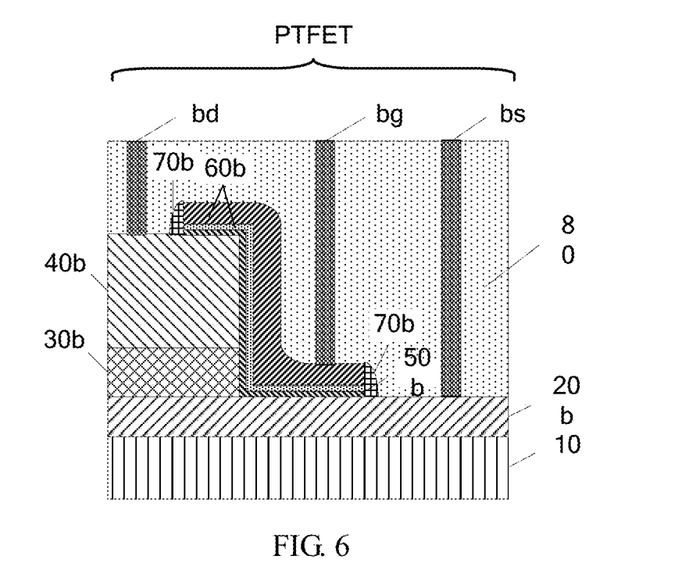
FIG. 6 is a fifth schematic structural diagram of a complementary tunneling field effect transistor according to an embodiment of the present application.

Alternatively, as shown in FIG. 6, a structure of the tunneling field effect transistor provided in this embodiment of the present application may be manufactured as having only the P-type tunneling field effect transistor, including: the substrate 10; the first source region 20b that is disposed on the substrate 10; the second channel 30b that is disposed on the first source region 20b; the second drain region 40b that is disposed on the second channel 30b; the second epitaxial layer 50b that is disposed on the first source region 20b and the second drain region 40b, where the second epitaxial layer 50b covers the side wall of the second drain region 40b and the second channel 30b; the second gate stack layer 60b that is disposed on the second epitaxial layer 50b; the second isolator 70b that is disposed on the first source region 20b and the second drain region 40b, where the second isolator 70b is in contact with the second epitaxial layer 50b and the second gate stack layer 60b; the second insulation layer 80 that is disposed on the first source region 20b, the second drain region 40b, the second isolator 70b, and the second gate stack layer 60b; the second source bs that is disposed on the first source region 20b, the second gate bg that is disposed on the second gate conductive layer, and the second drain bd that is disposed on the second drain region 40b.

This embodiment of the present application provides a complementary tunneling field effect transistor. The complementary tunneling field effect transistor includes a first tunneling field effect transistor and a second tunneling field effect transistor. The first tunneling field effect transistor includes a first drain region, a first channel, a second source region, a first epitaxial layer, and a first gate stack layer. The second tunneling field effect transistor includes a second drain region, a second channel, a first source region, a second epitaxial layer, and a second gate stack layer. The first drain region and the first source region include a first dopant, and the second source region and the second drain region include a second dopant. Dopants in the first drain region and the second source region that are in the first tunneling field effect transistor and dopants in the first source region and the second drain region that are in the second tunneling field effect transistor are evenly distributed instead of Gaussian distribution of ion injected dopants in the prior art. Therefore, impurity concentration between the second source region and the first epitaxial layer and between the first source region and the second epitaxial layer may be mutated in a relatively short distance, so as to increase carrier tunneling efficiency and improve performance of the tunneling field effect transistor.

Embodiment 2

Figure 7:
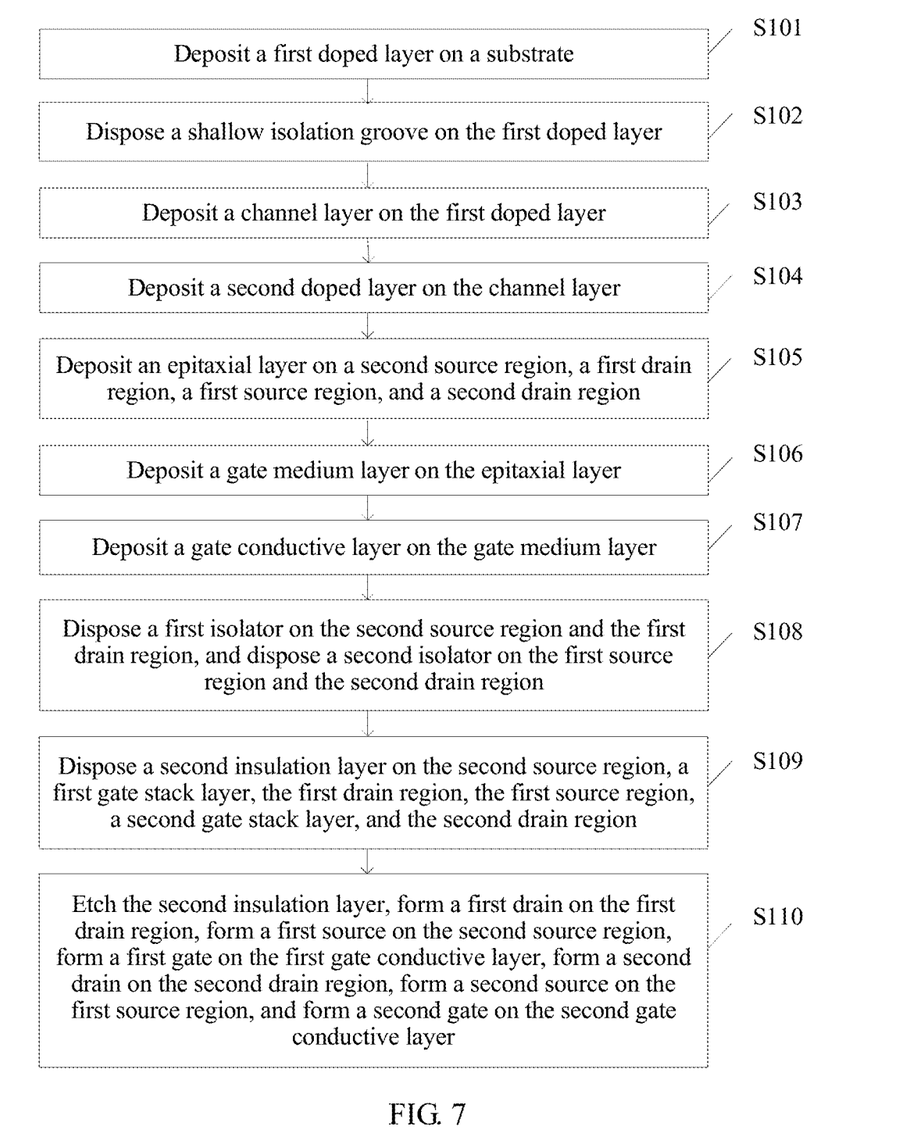
FIG. 7 is a schematic flowchart of a complementary tunneling field effect transistor manufacturing method according to an embodiment of the present application.

This embodiment of the present application provides a complementary tunneling field effect transistor manufacturing method. FIG. 7 is a schematic flowchart of the manufacturing method.

S101. Deposit a first doped layer on a substrate.

Figure 8:
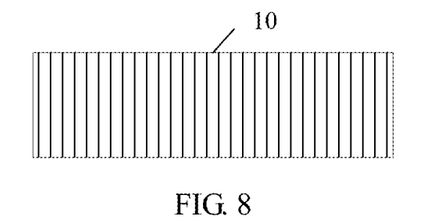
FIG. 8 is a first schematic diagram of a complementary tunneling field effect transistor manufacturing process according to an embodiment of the present application.

FIG. 8 shows a substrate 10. It should be added that the substrate 10 may be a semiconductor substrate, and a specific material of the substrate 10 may be germanium, silicon, germanium silicon, or a three-five compound.

Figure 9:
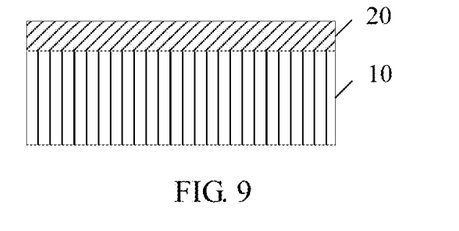
FIG. 9 is a second schematic diagram of a complementary tunneling field effect transistor manufacturing process according to an embodiment of the present application.

As shown in FIG. 9, a first doped layer 20 is deposited on the substrate 10.

It should be noted that the first doped layer 20 includes a first dopant, and the first dopant is doped in a semiconductor thin film. Concentration of the first dopant is higher than $10^{19}$ per cubic centimeter, and is between $10^{19}$ per cubic centimeter and $10^{21}$ per cubic centimeter. A material of the semiconductor thin film is germanium, silicon, germanium silicon, or a three-five compound. This is not limited in the present application.

It should be added that thickness of the first doped layer is from tens of nanometers to hundreds of nanometers.

S102. Dispose a shallow isolation groove on the first doped layer.

Figure 10:
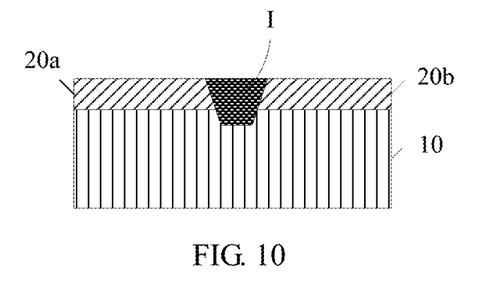
FIG. 10 is a third schematic diagram of a complementary tunneling field effect transistor manufacturing process according to an embodiment of the present application.

It should be noted that according to the complementary tunneling field effect transistor manufacturing method provided in this embodiment of the present application, as shown in FIG. 10, after the first doped layer 20 is formed on the substrate 10, the manufacturing method further includes disposing a shallow isolation groove I on the first doped layer 20. The shallow isolation groove I is located between a first drain region 20a and a first source region 20b. A bottom of the shallow isolation groove I is equal to or lower than a bottom of the first doped layer 20.

It should be added that the shallow isolation groove I is optional, that is, when the shallow isolation groove I is not disposed, the first doped layer may be etched in an etching process, and a second insulation layer is filled to isolate the first drain region 20a and the first source region 20b.

S103. Deposit a channel layer on the first doped layer.

Figure 11:
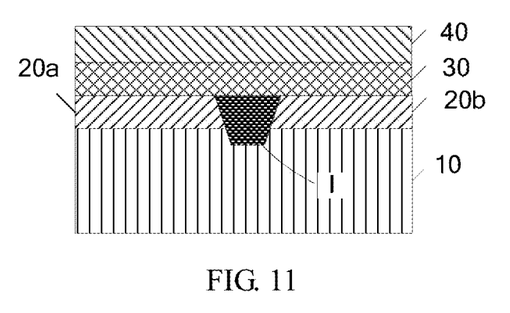
FIG. 11 is a fourth schematic diagram of a complementary tunneling field effect transistor manufacturing process according to an embodiment of the present application.

As shown in FIG. 11, a channel layer 30 is formed on the first doped layer.

It should be noted that the channel layer 30 is a lightly doped layer or a first insulation layer. The light doping may be understood that an impurity is evenly added to the semiconductor thin film, and impurity concentration is less than or equal to $10^{15}$ per cubic centimeter. A material of the semiconductor thin film is germanium, silicon, germanium silicon, or a three-five compound. The channel layer 30 may further be the first insulation layer. This is not limited in the present application.

It should be added that thickness of the channel layer 30 is from tens of nanometers to hundreds of nanometers.

S104. Deposit a second doped layer on the channel layer.

As shown in FIG. 11, a second doped layer 40 is deposited on the channel layer 30.

It should be noted that the second doped layer 40 includes a second dopant, and the second dopant is doped in a semiconductor thin film. Concentration of the second dopant is higher than $10^{19}$ per cubic centimeter, and is between $10^{19}$ per cubic centimeter and $10^{21}$ per cubic centimeter. A material of the semiconductor thin film is germanium, silicon, germanium silicon, or a three-five compound.

It should be added that thickness of the second doped layer 40 is from tens of nanometers to hundreds of nanometers.

Figure 12:
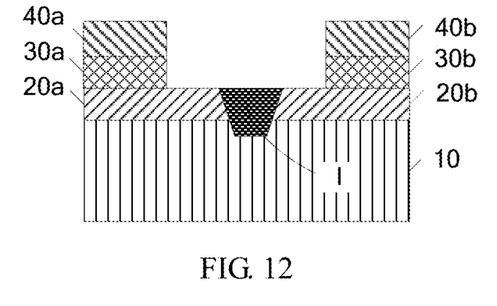
FIG. 12 is a fifth schematic diagram of a complementary tunneling field effect transistor manufacturing process according to an embodiment of the present application.

With photoetching and etching processes, as shown in FIG. 12, the channel layer 30 and the second doped layer 40 in a middle part are removed to form a second source region 40a, a second drain region 40b, a first channel 30a, and a second channel 30b. The first channel 30a is located on the first drain region 20a, the second source region 40a is located on the first channel 30a, the second channel 30b is located on the first source region 20b, and the second drain region 40b is located on the second channel 30b.

S105. Deposit an epitaxial layer on a second source region, a first drain region, a first source region, and a second drain region.

Figure 13:
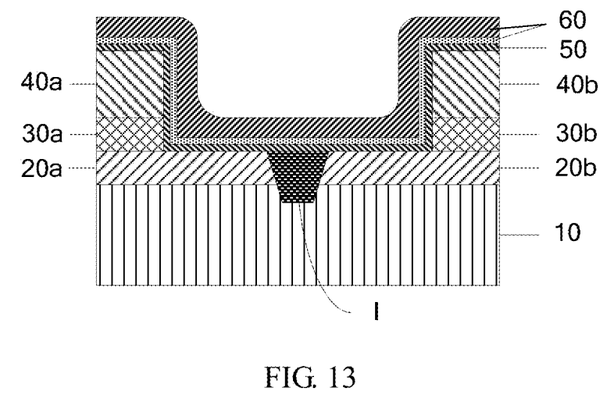
FIG. 13 is a sixth schematic diagram of a complementary tunneling field effect transistor manufacturing process according to an embodiment of the present application.

As shown in FIG. 13, an epitaxial layer 50 is deposited on the second source region 40a, the first drain region 20a, the first source region 20b, and the second drain region 40b.

It should be noted that the epitaxial layer 50 is a lightly doped semiconductor thin film, and a material of the semiconductor thin film is germanium, silicon, germanium silicon, or a three-five compound. The light doping means that added impurity concentration is less than or equal to $10^{15}$ per cubic centimeter.

It should be added that thickness of the epitaxial layer 50 is between 1 nanometer to 10 nanometers.

S106. Deposit a gate medium layer on the epitaxial layer.

As shown in FIG. 13, the gate medium layer is deposited on the epitaxial layer 50.

It should be noted that a material of the gate medium layer may be silicon dioxide, silicon nitride, a high dielectric material, or another insulating material.

S107. Deposit a gate conductive layer on the gate medium layer.

As shown in FIG. 13, the gate conductive layer is deposited on the gate medium layer, and the gate medium layer and the gate conductive layer constitute a gate stack layer 60.

Figure 14:
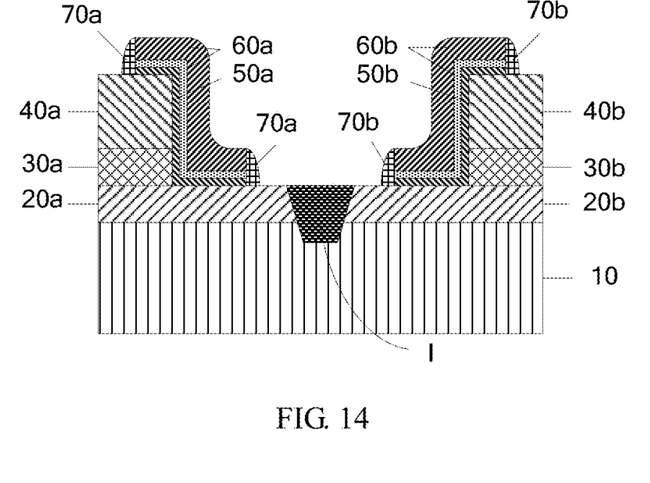
FIG. 14 is a seventh schematic diagram of a complementary tunneling field effect transistor manufacturing process according to an embodiment of the present application.

A material of the gate conductive layer may be polycrystalline silicon, titanium nitride, a metal, or another conductive material, and thickness of the gate conductive layer is tens of nanometers. It should be noted that, as shown in FIG. 14, after the gate conductive layer is formed on the gate medium layer, a first epitaxial layer 50a and a first gate stack layer 60a that are of a first tunneling field effect transistor and a second epitaxial layer 50b and a second gate stack layer 60b that are of a second tunneling field effect transistor are formed in an etching process. The first gate stack layer 60a is located above the first epitaxial layer 50a, the second gate stack layer 60b is located above the second epitaxial layer 50b, the first epitaxial layer 50a covers a side wall of the first channel 30a and the second source region 40a, and the second epitaxial layer 50b covers a side wall of the second channel 30b and the second drain region 40b.

It should be noted that the epitaxial layer 50 described in this embodiment of the present application includes the first epitaxial layer 50a and the second epitaxial layer 50b, that is, the epitaxial layer 50 is partially etched to form the first epitaxial layer 50a and the second epitaxial layer 50b. Likewise, so do relationships between the gate medium layer and a first gate medium layer and a second gate medium layer, and between the gate conductive layer and a first gate conductive layer and a second gate conductive layer.

The first drain region 20a, the first channel 30a, the second source region 40a, the first epitaxial layer 50a, and the first gate stack layer 60a form the first tunneling field effect transistor, and the second drain region 40b, the second channel 30b, the first source region 20b, the second epitaxial layer 50b, and the second gate stack layer 60b form the second tunneling field effect transistor.

It should be noted that the first dopant is a P-type dopant and the second dopant is an N-type dopant, or the first dopant is an N-type dopant and the second dopant is a P-type dopant.

Further, if the first dopant is an N-type dopant and the second dopant is a P-type dopant, the first tunneling field effect transistor is an N-type tunneling field effect transistor, and the second tunneling field effect transistor is a P-type tunneling field effect transistor; or if the first dopant is a P-type dopant and the second dopant is an N-type dopant, the first tunneling field effect transistor is a P-type tunneling field effect transistor, and the second tunneling field effect transistor is an N-type tunneling field effect transistor.

S108. Dispose a first isolator on the second source region and the first drain region, and dispose a second isolator on the first source region and the second drain region.

As shown in FIG. 14, a first isolator 70a is disposed on the second source region 40a and the first drain region 20a, and a second isolator 70b is disposed on the first source region 20b and the second drain region 40b.

The first isolator 70a is in contact with the first epitaxial layer 50a and the first gate stack layer 60a, and the second isolator 70b is in contact with the second epitaxial layer 50b and the second gate stack layer 60b. It should be added that materials of both the first isolator 70a and the second isolator 70b are silicon dioxide, silicon nitride, high dielectric materials, or other insulating materials.

S109. Dispose a second insulation layer on the second source region, a first gate stack layer, the first drain region, the first source region, a second gate stack layer, and the second drain region.

Figure 15:
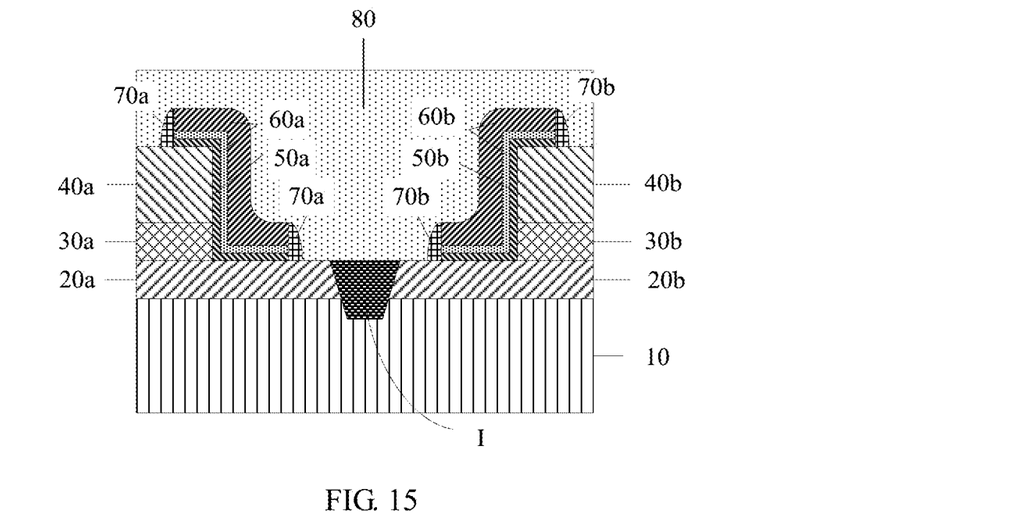
FIG. 15 is an eighth schematic diagram of a complementary tunneling field effect transistor manufacturing process according to an embodiment of the present application.

As shown in FIG. 15, a second insulation layer 80 is disposed on the second source region 40a, the first gate stack layer 60a, the first drain region 20a, the first source region 20b, the second gate stack layer 60b, and the second drain region 40b.

Specifically, a process of forming the second insulation layer 80 is filling a low dielectric material or another insulating material.

S110. Etch the second insulation layer, form a first drain on the first drain region, form a first source on the second source region, form a first gate on the first gate conductive layer, form a second drain on the second drain region, form a second source on the first source region, and form a second gate on the second gate conductive layer.

Figure 16:
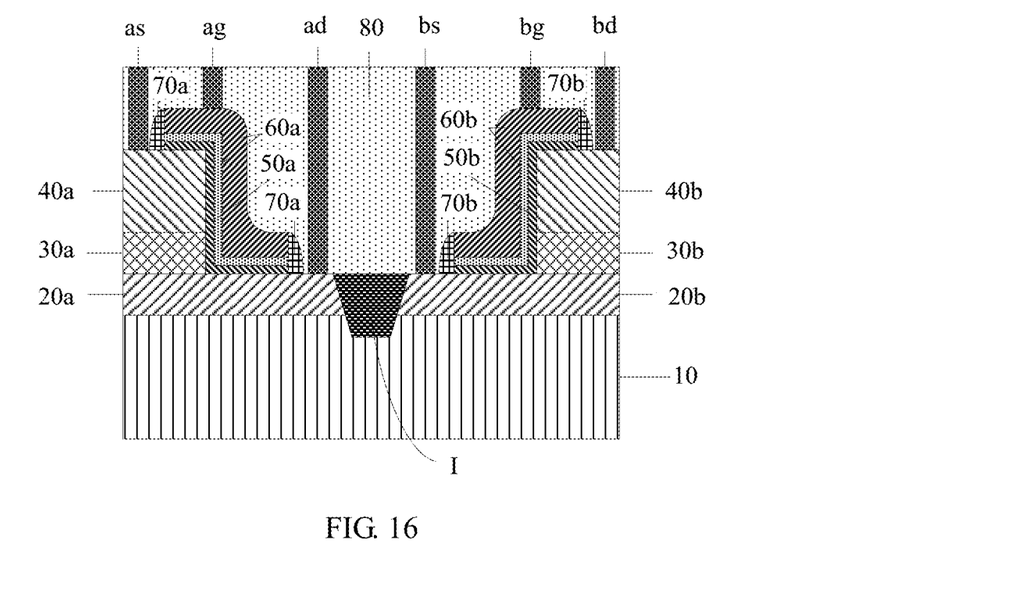
FIG. 16 is a ninth schematic diagram of a complementary tunneling field effect transistor manufacturing process according to an embodiment of the present application.

It should be noted that after the second insulation layer 80 is disposed, a metal electrode contact window is manufactured in the photoetching and etching processes, a metal is deposited on the metal electrode contact window, and metal electrodes of a source, a drain, and a gate of a transistor are manufactured by using a lift-off technology.

Specifically, as shown in FIG. 16, a first drain ad is formed on the first drain region 20a, a first source as is formed on the second source region 40a, a first gate ag is formed on the first gate conductive layer, a second drain bd is formed on the second drain region 40b, a second source bs is formed on the first source region 20b, and a second gate bg is formed on the second gate conductive layer. The first drain ad, the second source bs, the first gate ag, the first source as, the second drain bd, and the second gate bg are not in contact with each other, and may all be metal electrodes.

The tunneling field effect transistor manufactured according to the manufacturing method provided in this embodiment of the present application may be an N-type tunneling field effect transistor (NTFET), a P-type tunneling field effect transistor (PTFET), or a complementary tunneling field effect transistor that combines the N-type tunneling field effect transistor and the P-type tunneling field effect transistor. This is not limited in the present application.

Further, the tunneling field effect transistor provided in this embodiment of the present application works by using a line tunneling working mechanism. The line tunneling mechanism means that a carrier tunneling direction is parallel to a gate electric field direction, a gate control capability is relatively strong, and a tunneling current magnitude may be regulated according to an overlapping area of a gate region and a source region.

Regardless of the N-type tunneling field effect transistor or the P-type tunneling field effect transistor, a transistor on-state current is provided by a tunneling junction formed by the source region and an epitaxial layer. Specifically, an on-state current of the N-type tunneling field effect transistor is formed when an electron in the source region tunnels to the epitaxial layer that is in contact with the source region, and an on-state current of the P-type tunneling field effect transistor is formed when an electron hole in the source region tunnels to the epitaxial layer that is in contact with the source region. Because the line tunneling mechanism has advantages that a carrier tunneling probability can be improved, the on-state current is linearly adjustable in a specific range, and the like, the tunneling field effect transistor provided in the present application has a higher on-state current, a smaller subthreshold swing, and a greater current adjustment degree of freedom.

It should be further added that, generally, similar to an MOSFET, a current driving capability of the P-type tunneling field effect transistor is weaker than a current driving capability of the N-type tunneling field effect transistor. The complementary tunneling field effect transistor provided in this embodiment of the present application may further increase a tunneling junction area of the P-type tunneling field effect transistor to increase the on-state current of the P-type tunneling field effect transistor, so as to match the on-state current of the N-type tunneling field effect transistor.

Specifically, a first source region of the P-type tunneling field effect transistor part is over-etched to some extent to form an L-shaped surface, so as to increase the tunneling junction area of the P-type tunneling field effect transistor, and increase the on-state current of the P-type tunneling field effect transistor to match the on-state current of the N-type tunneling field effect transistor.

This embodiment of the present application provides a tunneling field effect transistor manufacturing method. The manufacturing method includes: successively depositing a first doped layer, a channel layer, and a second doped layer on a substrate, where the first doped layer includes a first dopant, and the second doped layer includes a second dopant; etching the second doped layer, the channel layer, and the first doped layer to form a second source region, a second drain region, a first channel, a second channel, a first drain region, and a first source region, where the first channel is located on the first drain region, the second source region is located on the first channel, the second channel is located on the first source region, and the second drain region is located on the second channel; successively depositing an epitaxial layer and a gate stack layer on the second source region, the first drain region, the first source region, and the second drain region; and etching the gate stack layer and the epitaxial layer to successively form a first gate stack layer, a second gate stack layer, a first epitaxial layer, and a second epitaxial layer, where the first gate stack layer is located above the first epitaxial layer, the second gate stack layer is located above the second epitaxial layer, the first epitaxial layer covers a side wall of the first channel and the second source region, and the second epitaxial layer covers a side wall of the second channel and the second drain region. The first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

Based on the foregoing embodiment descriptions, the complementary tunneling field effect transistor obtained by using the manufacturing method provided in this embodiment of the present application includes a first tunneling field effect transistor and a second tunneling field effect transistor. The first tunneling field effect transistor includes a first drain region, a first channel, a second source region, a first epitaxial layer, and a first gate stack layer. The second tunneling field effect transistor includes a second drain region, a second channel, a first source region, a second epitaxial layer, and a second gate stack layer. The first drain region and the first source region include a first dopant, and the second source region and the second drain region include a second dopant. Dopants in the first drain region and the second source region that are in the first tunneling field effect transistor and dopants in the first source region and the second drain region that are in the second tunneling field effect transistor are evenly distributed instead of Gaussian distribution of ion injected dopants in the prior art. Therefore, impurity concentration between the second source region and the first epitaxial layer and between the first source region and the second epitaxial layer may be mutated in a relatively short distance, so as to increase carrier tunneling efficiency and improve performance of the tunneling field effect transistor.

Finally, it should be noted that the foregoing embodiments are merely intended for describing the technical solutions of the present application but not for limiting the present application. Although the present application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present application.

What is claimed is:

1. A complementary tunneling field effect transistor, comprising:
   a first drain region and a first source region disposed on a substrate, wherein the first drain region and the first source region comprise a first dopant;
   a first channel disposed on the first drain region and a second channel disposed on the first source region;
   a second source region disposed on the first channel and a second drain region disposed on the second channel, wherein the second source region and the second drain region comprise a second dopant;
   a first epitaxial layer disposed on the first drain region and the second source region, and a second epitaxial layer disposed on the second drain region and the first source region, wherein the first epitaxial layer covers a side wall of the first channel and the second source region, and the second epitaxial layer covers a side wall of the second channel and the second drain region;
   a first gate stack layer disposed on the first epitaxial layer, and a second gate stack layer disposed on the second epitaxial layer;
   a first isolator disposed on the second source region and the first drain region, and a second isolator disposed on the first source region and the second drain region, wherein the first isolator is in contact with the first epitaxial layer and the first gate stack layer, and the second isolator is in contact with the second epitaxial layer and the second gate stack layer; and
   wherein the first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

2. The complementary tunneling field effect transistor according to claim 1, wherein:
   the first dopant is a P-type dopant and the second dopant is an N-type dopant, or the first dopant is an N-type dopant and the second dopant is a P-type dopant;
   an impurity concentration of the first dopant and the second dopant is within a range from about $10^{19}$ per cubic centimeter to $10^{21}$ per cubic centimeter;
   the first channel and the second channel are lightly doped layers or first insulation layers; and
   an impurity concentration in the lightly doped layers is less than or equal to $10^{15}$ per cubic centimeter.

3. The complementary tunneling field effect transistor according to claim 1, wherein:
   the first gate stack layer comprises a first gate medium layer and a first gate conductive layer, and the second gate stack layer comprises a second gate medium layer and a second gate conductive layer; and
   the complementary tunneling field effect transistor further comprises:
     a second insulation layer disposed on the second source region, the first gate stack layer, the first drain region, the first source region, the second gate stack layer, and the second drain region,
     a first drain disposed on the first drain region, a first source disposed on the second source region, and a first gate disposed on the first gate conductive layer, and
     a second drain disposed on the second drain region, a second source disposed on the first source region, and a second gate disposed on the second gate conductive layer.

4. The complementary tunneling field effect transistor according to claim 1, further comprising:
   a shallow isolation groove disposed between the first drain region and the first source region.

5. The complementary tunneling field effect transistor according to claim 1, wherein:
   materials of the substrate, the first drain region, the first source region, the second drain region, the second source region, the first epitaxial layer, the second epitaxial layer, the first channel, and the second channel comprise at least one of silicon, germanium, germanium silicon, or three-five compounds;
   materials of the first gate medium layer and the second gate medium layer comprise at least one of silicon dioxide, silicon nitride, or high dielectric materials; and
   materials of the first gate conductive layer and the second gate conductive layer comprise at least one of polycrystalline silicon, titanium nitride, or metal materials.

6. A complementary tunneling field effect transistor manufacturing method, comprising:
   successively depositing a first doped layer, a channel layer, and a second doped layer on a substrate, wherein the first doped layer comprises a first dopant, and the second doped layer comprises a second dopant;
   etching the second doped layer, the channel layer, and the first doped layer to form a second source region, a second drain region, a first channel, a second channel, a first drain region, and a first source region, wherein the first channel is located on the first drain region, the second source region is located on the first channel, the second channel is located on the first source region, and the second drain region is located on the second channel;
   successively depositing an epitaxial layer and a gate stack layer on the second source region, the first drain region, the first source region, and the second drain region;
   etching the gate stack layer and the epitaxial layer to successively form a first gate stack layer, a second gate stack layer, a first epitaxial layer, and a second epitaxial layer, wherein the first gate stack layer is located above the first epitaxial layer, the second gate stack layer is located above the second epitaxial layer, the first epitaxial layer covers a side wall of the first channel and the second source region, and the second epitaxial layer covers a side wall of the second channel and the second drain region;

disposing a first isolator on the second source region and the first drain region, and disposing, a second isolator on the first source region and the second drain region, wherein the first isolator is in contact with the first epitaxial layer and the first gate stack layer, and the second isolator is in contact with the second epitaxial layer and the second gate stack layer; and wherein the first drain region, the first channel, the second source region, the first epitaxial layer, and the first gate stack layer form a first tunneling field effect transistor, and the second drain region, the second channel, the first source region, the second epitaxial layer, and the second gate stack layer form a second tunneling field effect transistor.

7. The manufacturing method according to claim 6, wherein:

the first dopant is a P-type dopant and the second dopant is an N-type dopant, or the first dopant is an N-type dopant and the second dopant is a P-type dopant;

an impurity concentration of the first dopant and the second dopant is within a range from about $10^{19}$ per cubic centimeter to $10^{21}$ per cubic centimeter;

the first channel and the second channel are lightly doped layers or first insulation layers; and an impurity concentration in the lightly doped layers is less than or equal to $10^{15}$ per cubic centimeter.

8. The manufacturing method according to claim 6, wherein:

the first gate stack layer comprises a first gate medium layer and a first gate conductive layer, and the second gate stack layer comprises a second gate medium layer and a second gate conductive layer;

after etching the gate stack layer and the epitaxial layer to successively form the first gate stack layer, the second gate stack layer, the first epitaxial layer, and the second epitaxial layer, the manufacturing method further comprises:

disposing a second insulation layer on the second source region, the first gate stack layer, the first drain region, the first source region, the second gate stack layer, and the second drain region; and etching the second insulation layer, forming a first drain on the first drain region, forming a first source on the second source region, forming a first gate on the first gate conductive layer, forming a second drain on the second drain region, forming a second source on the first source region, and forming a second gate on the second gate conductive layer.

9. The manufacturing method according to claim 6, wherein after depositing the first doped layer on the substrate, and before depositing the channel layer, the manufacturing method further comprises:

disposing a shallow isolation groove on the first doped layer, wherein the shallow isolation groove is located between the first drain region and the first source region.

10. The manufacturing method according to claim 6, wherein:

materials of the substrate, the first drain region, the first source region, the second drain region, the second source region, the first epitaxial layer, the second epitaxial layer, the first channel, and the second channel comprise at least one of silicon, germanium, germanium silicon, or three-five compounds;

materials of the first gate medium layer and the second gate medium layer comprise silicon dioxide, silicon nitride, or high k dielectric materials; and materials of the first gate conductive layer and the second gate conductive layer comprise at least one of polycrystalline silicon, titanium nitride, or metal materials.

* * * * *